United States Patent
Bailey, III et al.

(10) Patent No.: US 7,232,766 B2
(45) Date of Patent: Jun. 19, 2007

(54) SYSTEM AND METHOD FOR SURFACE REDUCTION, PASSIVATION, CORROSION PREVENTION AND ACTIVATION OF COPPER SURFACE

(75) Inventors: Andrew D. Bailey, III, Pleasanton, CA (US); Shrikant P. Lohokare, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 8 days.

(21) Appl. No.: 10/769,408

(22) Filed: Jan. 30, 2004

(65) Prior Publication Data

US 2005/0087759 A1   Apr. 28, 2005

Related U.S. Application Data

(63) Continuation-in-part of application No. 10/390,117, filed on Mar. 14, 2003, now Pat. No. 6,939,796, and a continuation-in-part of application No. 10/390,520, filed on Mar. 14, 2003, now Pat. No. 6,821,899.

(51) Int. Cl.
    *H01L 21/302*   (2006.01)
(52) U.S. Cl. ............... 438/714; 438/715; 438/742
(58) Field of Classification Search ........ 438/742, 438/754, 706, 714–715, 719–722
    See application file for complete search history.

(56) References Cited

U.S. PATENT DOCUMENTS

| | | | |
|---|---|---|---|
| 4,985,113 A | 1/1991 | Fujimoto et al. | |
| 5,009,738 A | 4/1991 | Gruenwald et al. | |
| 5,098,516 A | 3/1992 | Norman et al. | |
| 5,118,636 A | * 6/1992 | Hosaka ...................... | 438/421 |
| 5,200,031 A | 4/1993 | Latchford et al. | |
| 5,256,565 A | 10/1993 | Bernhardt et al. | |
| 5,302,241 A | 4/1994 | Cathey, Jr. | |
| 5,380,397 A | 1/1995 | Fukuyama et al. | |
| 5,387,315 A | 2/1995 | Sandhu | |
| 5,534,751 A | 7/1996 | Lenz et al. | |
| 5,556,714 A | 9/1996 | Fukuyama et al. | |
| 5,744,402 A | 4/1998 | Fukazawa et al. | |
| 5,770,100 A | 6/1998 | Fukuyama et al. | |

(Continued)

FOREIGN PATENT DOCUMENTS

EP   1 041 614 A1   10/2000

(Continued)

OTHER PUBLICATIONS

Y. Oshita, N. Howi, "Lower temperature plasma etching of Cu using IR light irradiation", Thin Solid Films, 1995.

(Continued)

*Primary Examiner*—Ori Nadav
(74) *Attorney, Agent, or Firm*—Martine Penilla & Gencarella, LLP

(57) ABSTRACT

A system and method of passivating an exposed conductive material includes placing a substrate in a process chamber and injecting a hydrogen species into the process chamber. A hydrogen species plasma is formed in the process chamber. A surface layer species is reduced from a top surface of the substrate is reduced. The reduced surface layer species are purged from the process chamber.

15 Claims, 3 Drawing Sheets

U.S. PATENT DOCUMENTS

| | | | |
|---|---|---|---|
| 5,968,847 A | 10/1999 | Ye et al. | |
| 6,004,188 A | 12/1999 | Roy | |
| 6,008,130 A | 12/1999 | Henderson et al. | |
| 6,051,496 A | 4/2000 | Jang | |
| 6,056,864 A | 5/2000 | Cheung | |
| 6,083,822 A | 7/2000 | Lee | |
| 6,096,230 A | 8/2000 | Scatz et al. | |
| 6,133,144 A | 10/2000 | Tsai et al. | |
| 6,140,226 A | 10/2000 | Grill et al. | |
| 6,147,005 A | 11/2000 | Tu et al. | |
| 6,153,116 A | 11/2000 | Yang et al. | |
| 6,153,530 A | 11/2000 | Ye et al. | |
| 6,159,857 A | 12/2000 | Liu et al. | |
| 6,174,813 B1 | 1/2001 | Wang | |
| 6,184,128 B1 | 2/2001 | Wang et al. | |
| 6,221,775 B1 | 4/2001 | Ference et al. | |
| 6,227,140 B1 | 5/2001 | Kennedy et al. | |
| 6,234,870 B1 | 5/2001 | Uzoh et al. | |
| 6,303,505 B1 | 10/2001 | Ngo et al. | |
| 6,313,025 B1 | 11/2001 | Chittipeddi et al. | |
| 6,323,121 B1 | 11/2001 | Liu et al. | |
| 6,331,380 B1 | 12/2001 | Ye et al. | |
| 6,350,364 B1 | 2/2002 | Jang | |
| 6,350,664 B1 | 2/2002 | Haji et al. | |
| 6,352,081 B1 | 3/2002 | Lu et al. | |
| 6,365,327 B1 | 4/2002 | Chittipeddi et al. | |
| 6,368,517 B1 | 4/2002 | Hwang et al. | |
| 6,383,935 B1 | 5/2002 | Lin et al. | |
| 6,408,786 B1 | 6/2002 | Kennedy et al. | |
| 6,417,093 B1 | 7/2002 | Xie et al. | |
| 6,423,200 B1 | 7/2002 | Hymes | |
| 6,440,840 B1 | 8/2002 | Chen | |
| 6,448,176 B1 | 9/2002 | Grill et al. | |
| 6,475,298 B1 | 11/2002 | O'Donnell et al. | |
| 6,479,391 B2 | 11/2002 | Morrow et al. | |
| 6,482,331 B2 | 11/2002 | Lu et al. | |
| 6,482,755 B1 | 11/2002 | Ngo et al. | |
| 6,486,059 B2 | 11/2002 | Lee et al. | |
| 6,500,357 B1 | 12/2002 | Luo et al. | |
| 6,517,413 B1 | 2/2003 | Hu et al. | |
| 6,527,911 B1 | 3/2003 | Yen et al. | |
| 6,554,914 B1 | 4/2003 | Rozbicki et al. | |
| 6,559,049 B2 | 5/2003 | Chen et al. | |
| 6,573,187 B1 | 6/2003 | Chen et al. | |
| 6,576,550 B1 | 6/2003 | Brase et al. | |
| 6,579,800 B2 | 6/2003 | Basol et al. | |
| 6,582,974 B1 | 6/2003 | Lui et al. | |
| 6,600,229 B2 | 7/2003 | Mukherjee et al. | |
| 6,617,232 B2 | 9/2003 | Kim et al. | |
| 6,620,726 B1 | 9/2003 | Preusse et al. | |
| 6,630,413 B2 | 10/2003 | Todd | |
| 6,653,224 B1 | 11/2003 | Gotkis et al. | |
| 6,767,829 B2 | 7/2004 | Akahori | |
| 7,122,477 B2 | 10/2006 | Ikeda | |
| 2001/0003060 A1 | 6/2001 | Yokohama et al. | |
| 2001/0015175 A1 | 8/2001 | Masuda et al. | |
| 2001/0018271 A1 | 8/2001 | Yanagisawa | |
| 2001/0054381 A1 | 12/2001 | Umotoy et al. | |
| 2002/0016084 A1 | 2/2002 | Todd | |
| 2002/0045354 A1 | 4/2002 | Ye et al. | |
| 2002/0081854 A1 | 6/2002 | Morrow et al. | |
| 2002/0121500 A1 | 9/2002 | Annapragada et al. | |
| 2002/0124867 A1* | 9/2002 | Kim et al. | 134/1.2 |
| 2002/0153350 A1 | 10/2002 | Lu et al. | |
| 2002/0155695 A1 | 10/2002 | Lee et al. | |
| 2002/0175071 A1 | 11/2002 | Hymes | |
| 2002/0182853 A1 | 12/2002 | Chen et al. | |
| 2002/0187627 A1 | 12/2002 | Yuang | |
| 2002/0192957 A1 | 12/2002 | Chien et al. | |
| 2002/0192966 A1 | 12/2002 | Shanmugasundram et al. | |
| 2003/0013316 A1 | 1/2003 | Kim et al. | |
| 2003/0029567 A1 | 2/2003 | Dhindsa et al. | |
| 2003/0032278 A1 | 2/2003 | Chen et al. | |
| 2003/0044725 A1 | 3/2003 | Hsue et al. | |
| 2003/0045100 A1 | 3/2003 | Saka et al. | |
| 2003/0049375 A1 | 3/2003 | Nguyen et al. | |
| 2003/0057179 A1 | 3/2003 | Luo et al. | |
| 2003/0073319 A1 | 4/2003 | Basol et al. | |
| 2003/0082996 A1 | 5/2003 | Fortin et al. | |
| 2003/0087586 A1 | 5/2003 | Kaushal et al. | |
| 2003/0092260 A1 | 5/2003 | Lui et al. | |
| 2003/0119305 A1 | 6/2003 | Huang et al. | |
| 2003/0164354 A1 | 9/2003 | Hsieh et al. | |
| 2003/0166345 A1 | 9/2003 | Chang | |
| 2003/0184732 A1 | 10/2003 | Katz et al. | |
| 2003/0186546 A1 | 10/2003 | Wollstein et al. | |
| 2003/0196989 A1 | 10/2003 | Zhou et al. | |
| 2003/0199112 A1 | 10/2003 | Shanmugasundram et al. | |
| 2003/0203321 A1 | 10/2003 | Ma et al. | |
| 2003/0211746 A1 | 11/2003 | Chen et al. | |
| 2003/0213558 A1 | 11/2003 | Basol et al. | |
| 2003/0224596 A1 | 12/2003 | Marxsen et al. | |
| 2004/0180545 A1 | 9/2004 | Lohokare et al. | |
| 2004/0242012 A1* | 12/2004 | Ikeda | 438/720 |

FOREIGN PATENT DOCUMENTS

| | | | |
|---|---|---|---|
| EP | 1 081 751 A2 | | 3/2001 |
| EP | 1 320 128 A1 | | 6/2003 |
| EP | 1320128 | * | 6/2003 |
| JP | 07230993 | | 8/1995 |
| JP | 07235543 | | 9/1995 |
| JP | 11 067766 | | 3/1999 |
| JP | 11-260913 | * | 9/1999 |
| JP | 2001 077094 | | 7/2001 |
| WO | WO 99/14800 | | 3/1999 |
| WO | WO 99/46812 | | 9/1999 |
| WO | WO 00/03426 | | 1/2000 |
| WO | WO 00/59005 | | 10/2000 |
| WO | WO 01/88229 | | 11/2001 |
| WO | WO 02/37541 A2 | | 5/2002 |
| WO | WO 03/026004 | | 3/2003 |
| WO | WO 03/058703 | | 7/2003 |

OTHER PUBLICATIONS

Lynn R. Allen, John M. Grant, "Tungsten plug etchback and substrate damage measured by atomic force microscopy", J. Vac. Sci Technol. May/Jun. 1995 pp. 918-922.

William F. Marx, Yunju Ra, Richard Yang, Ching-Hwa Chen, "Plasma and processing effects of electrode spacing for tungsten etchback using a bipolar electrostatic wafer clamp", J. Vac. Sci Technol. Nov./Dec. 1994 pp. 3087-3090.

J. Farkas, K.-M. Chi, M.J. Hampden-Smith, T.T. Kodas, "Low-temperature copper etching via reactions with $CI_2$ and $Pet_3$ under ultrahigh vacuum conditions", J. Appl. Phys, Feb. 1993, pp. 1455-1460.

Seongju Park, T.N. Rhodin, L.C. Rathbun, "Halide formation and etching of Cu thin films with $CI_2$ and $Br_2$", J. Vac. Sci Technol., Mar./Apr. 1986, pp. 168-172.

Lynn R. Allen, "Tungsten Plug Etchback In A TCP Etcher", Sharp Microelectronics Technology, Inc., pp. 255-263.

N. Hosoi, Y. Ohshita, "Plasma Etching Of Copper Films Using IR Light Irradiation", Mat. Res. Soc. Symp. Proc. vol. 337, 1994, pp. 201-205.

International Search Report.

International Search Report—Jul. 29, 2005.

Lynn R. Allen, "Tungsten Plug Etchback In A TCP Etcher", Sharp Microelectronics Technology, Inc., pp. 255-263, "Highly Selective Dry Etching and Damage Control" Pub. Jun. 1, 1993 Publisher: Electrochemical Society.

Taiwan Antecedent Notification Of Rejection Reasons For Primary Examination Decision (in Chinese), Sep. 11, 2006 Taiwan Antecedent Notification Of Rejection Reasons For Primary Examination Decision (English Translation), Sep. 11, 2006.

Tegal Corporation, "Enabling a Wireless World", p. 1, http://www.tegal.com/.

Tegal Corporation, "Corporate Information", pp. 1-7, http://www.tegal.com/corp/corpinfo.html.

Tegal Corporation, "Products and Services", p. 1, http://www.tegal.com/prod_srvcs/products_serv.html.

Tegal Corporation, "Products and Services, 6500 Hre Series", pp. 1-3, http://www.tegal.com/prod_srvcs/6500_prod.html.

Tegal Corporation, "Products and Services, 900 Series", pp. 1-4, http://www.tegal.com/prod_srvcs/900_prod.html.

Tegal Corporation, "Products and Services, Tegal i90X-The Next Generation in Plasma Etch Technology", pp. 1-4, http://www.tegal.com/prod_srvcs/i90x_data_sheet.html.

Nagraj S. Kulkrani, Robert T. DeHoff, "Application of Volatility Diagrams for Low Temperature, Dry Etching, and Planarization of Copper", Journal of The Electromechanical Society, 2002, pp. G620-G632.

Kazuhide Ohno, Masaaki Sato, Yoshinobu Arita, "Reactive Ion Etching of Copper Films in $SiCl_4$ and $N_2$ Mixture", Japanese Journal of Applied Physics, Jun. 1989, No. 6, Part 2, pp. 1070-1072.

K. Mosig, T. Jacobs, P. Kofron, M. Daniels, K. Brennan, A. Gonzales, R. Augur, J. Wetzel, R. Havemann, A. Shiota, "Single and Dual Damascene Integration of a Spin-on Porous Ultra low-k Material", *IEEE*, 2001 pp. 292-294.

David T. Price, Ronald J. Gutmann, Shyam P. Murarka, "Damascene copper interconnects with polymer ILDs", 1997 Thin Solid Films, pp. 523-528.

* cited by examiner

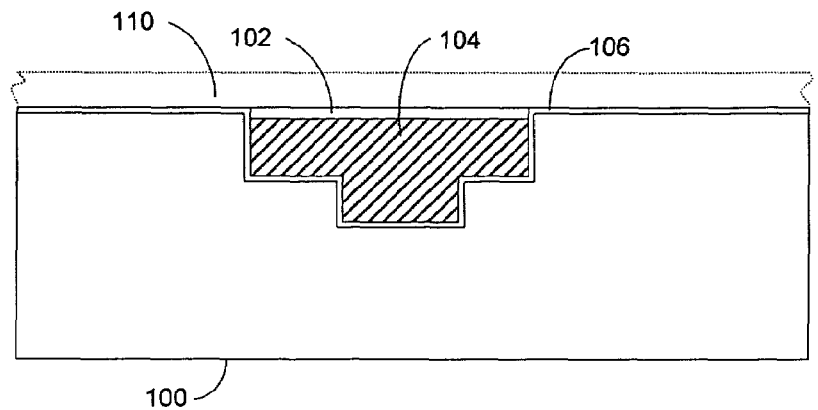
FIGURE 1
Prior Art
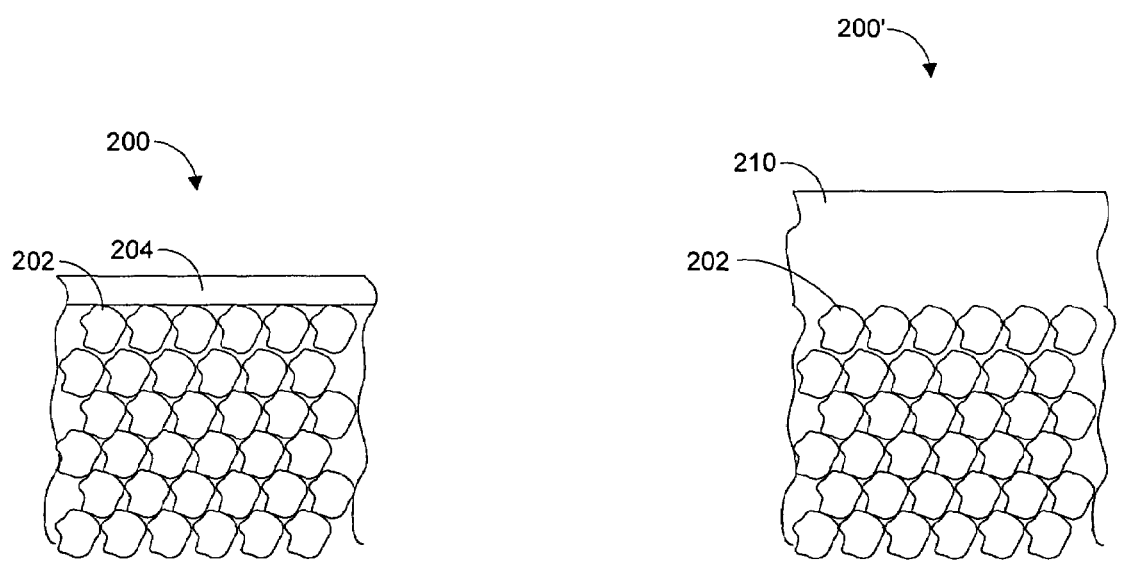
FIGURE 2A
FIGURE 2B

SYSTEM AND METHOD FOR SURFACE REDUCTION, PASSIVATION, CORROSION PREVENTION AND ACTIVATION OF COPPER SURFACE

CROSS REFERENCE TO RELATED APPLICATIONS

This application is a continuation-in-part of Ser. No. 10/390,117 and claims priority from U.S. Pat. No. 6,939,726 filed on Mar. 14, 2003 and entitled "System, Method and Apparatus For Improved Global Dual-Damascene Planarization," which is incorporated herein by reference in its entirety. This application is also a continuation-in-part of Ser. No. 10/390,520 and claims priority from U.S. Pat. 6,821,899 filed on Mar. 14, 2003 and entitled "System, Method and Apparatus For Improved Local Dual-Damascene Planarization," which is incorporated herein by reference in its entirety.

BACKGROUND OF THE INVENTION

1. Field of the Invention

The present invention relates generally to damascene semiconductor manufacturing processes, and more particularly, to methods and systems for planarizing features and layers in a semiconductor manufacturing process.

2. Description of the Related Art

In general, the manufacturing of the integrated circuit devices (in the form of semiconductor substrates and wafers) includes the use of plasma etching chambers. The plasma etch chambers are capable of etching selected layers on the substrate as defined by a mask or pattern. The plasma etch chambers are configured to receive processing gases (i.e., etch chemistries) while a radio frequency (RF) power is applied to one or more electrodes of the plasma etch chamber. The pressure inside the plasma etch chamber is also controlled for the particular process. Upon applying the desired RF power to the electrode(s), the process gases in the chamber are activated such that a plasma is created. The plasma is thus configured to perform the desired etching of the selected layers of the semiconductor wafer.

Low volatility byproducts are produced in some prior art plasma etch processes. By way of example, in a copper etch process using chlorine containing gases (e.g., $Cl_2$, HCl, etc), the byproduct is CuClx. CuClx is non-volatile at room temperature. The low-volatility byproducts typically condense on the chamber walls. During each plasma etch cycle, the byproducts build-up on the chamber walls. Eventually the byproducts build-up to a certain thickness. The byproduct build-up then begins to "flake" off of the chamber walls and is therefore becomes a significant particle source. The particles can contaminate the substrates being etched in the chamber.

The copper etchant chemistries are often corrosive to the surface of the remaining copper. This corrosive action can cause uneven pitting and leave an undesirable residue layer that must be removed before subsequent processing can occur. Typically, the substrate is removed from the plasma etch chamber and is cleaned and/or rinsed.

FIG. 1 shows a typical cleaned substrate 100. The substrate 100 has a relatively thick layer of oxide 102 (e.g., copper oxide) on top of the exposed copper device 104. The oxide layer 102 can interfere with subsequent processing (e.g., forming interconnects to the underlying copper device) and therefore must be removed before subsequent processing can be attempted. The substrate 100 can also have a barrier layer 106.

CMP chemistries can cause problems similar to those described above for the etching chemistries. A substrate is typically cleaned and rinsed after a CMP operation. The CMP process itself and/or cleaning and/or the rinsing operation can also cause an oxide layer to form.

In view of the foregoing, what is needed is a system and method of removing the residue layer while substantially eliminating the formation of the oxide layer or any other undesirable terminating layer.

SUMMARY OF THE INVENTION

Broadly speaking, the present invention fills these needs by providing an improved method of passivating an exposed conductive material. It should be appreciated that the present invention can be implemented in numerous ways, including as a process, an apparatus, a system, computer readable media, or a device. Several inventive embodiments of the present invention are described below.

A method of passivating an exposed conductive material includes placing a substrate in a process chamber and injecting a hydrogen species into the process chamber. A hydrogen species plasma is formed in the process chamber. A surface layer species is reduced from a top surface of the substrate is reduced. The reduced surface layer species are purged from the process chamber. The conductive material can include at least one of a group consisting of a copper containing material, elemental copper, alloys such as NiFe, CoFe, elemental Ni, Co, Ru, AlO, Ta, TaN, Pt and Ir.

The passivation process can be performed in situ. The passivation process can be performed ex situ. The passivation process can be performed in situ in an etch process. The passivation process can be performed in situ in a stress free planarization process. The passivation process can be performed ex situ following a CMP operation.

The process chamber can have a temperature of between about 30 and about 400 degrees C. The process chamber can be a small volume plasma chamber. The process chamber can be a capacitively coupled system, an inductively coupled system, an ECR or a microwave powered system. The process chamber can have a pressure of between about 1 mTorr and about 1000 mTorr.

The surface layer species can be an oxide, a halide (e.g., chloride, bromide, fluoride or iodide containing species) and a nitride or combinations thereof. The hydrogen species can include at least one of a group consisting of $H_2$, HCl, HBr, $CH_4$ and $NH_3$. Injecting the hydrogen species can also include injecting a carrier gas such as argon, nitrogen, helium, neon and xenon.

Forming a plasma with the hydrogen species can include volatilizing a residue on at least one of the substrate and an inner wall of the process chamber. Purging the reduced surface layer species from the process chamber can also include purging the volatilized residue.

Reducing the surface layer species from the top surface of the substrate can also include activating the top surface of the substrate and roughening the top surface of the substrate. The exposed conductive material is passivated with a predetermined time. The predetermined time being sufficient to reduce the surface layer species from the top surface of the substrate a desired amount. The predetermined time can be greater than about 15 seconds.

Another embodiment provides a method of passivating an exposed copper interconnect. The method includes placing a substrate in a process chamber and injecting a hydrogen species into the process chamber. The method also includes forming a hydrogen species plasma in the process chamber and reducing a copper oxide from a top surface of the exposed copper interconnect. The reduced copper oxides are purged from the process chamber. Each of several inner surfaces of the process chamber can have a temperature equal to or greater than about 250 degrees C. Each of the inner surfaces of the process chamber is exposed to the substrate.

Another embodiment provides a method of performing a non-contact planarization on a substrate. The method includes placing a substrate in an etch process chamber and etching the substrate. The method also includes injecting a hydrogen species into the etch process chamber and forming a hydrogen species plasma in the etch process chamber. A surface layer species is reduced from a top surface of the substrate and the reduced surface layer species are purged from the process chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 1 shows a typical cleaned substrate.

FIG. 2A shows a copper matrix, in accordance with one embodiment of the present invention.

FIG. 2B shows a passivated copper matrix, in accordance with one embodiment of the present invention.

DETAILED DESCRIPTION OF THE EXEMPLARY EMBODIMENTS

Figure 3A:
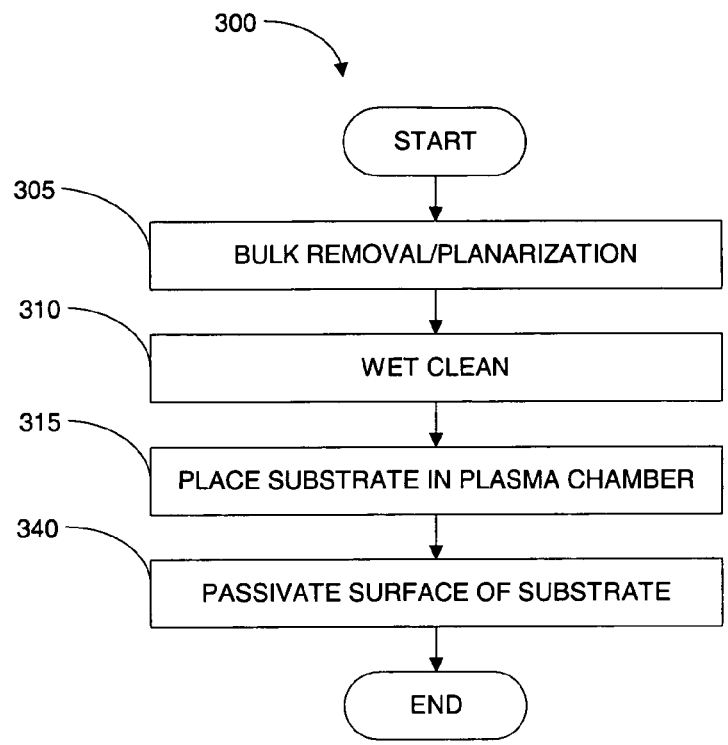
FIG. 3A is a flowchart of the method operations of a CMP process, in accordance with one embodiment of the present invention.

Several exemplary embodiments for passivating and reducing the surface of an etched surface will now be described. It will be apparent to those skilled in the art that the present invention may be practiced without some or all of the specific details set forth herein.

Exposed copper can be vulnerable to corrosion. This is especially true of processed copper when interconnect applications are exposed to various process chemistries (e.g., wet and dry chemistries). Some of these conditions can also employ corrosive chemistries. By way of example, a copper dry etch is typically slow and non-selective due to non-volatility at lower temperatures. Volatile compound formation is feasible in halogen containing chemistries (e.g., chlorine, fluorine, bromine, and iodine chemistries) at high temperatures (i.e., greater than about 200 degrees C.). Corrosion is a critical issue due to interaction of residual halogen compounds on the copper surface with moisture or interaction of residual halogen in the process chamber with non-passivated copper surface sites. The latter case may include stress free barrier removal following copper CMP or electropolish. Another example is copper processing for damascene applications that use CMP that employs corrosive alkaline slurries. Corrosion persists in spite of typical wet treatments. Further, the typical wet treatments can introduce additional process modules, additional chemical requirements and thereby increase production costs and production time.

Stable, activated surfaces are important in dual damascene processes for electrical as well as next layer deposition requirements. Typically, the newly exposed copper surface has surface characteristics that are different than that required for further processing. Additional process steps and process modules are required to modify the newly exposed copper surface to meet these needs. Modifications to the newly exposed copper surface include the reduction of the surface copper oxide layer to elemental copper and activation of the copper surface inside vacuum (e.g., less than about 100 mTorr) conditions. Other modifications can include removal of CMP residues that contain many components of the CMP process chemistries (e.g., brighteners, inhibitors, accelerators, etc.), therefore avoiding any wet cleaning processes following the CMP process.

One embodiment provides a system and method for passivating the newly etched surface so as to prevent corrosion. The disclosed system and method can remove the etchant chemistry residue from the etched substrate. The disclosed system and method can also remove the etchant chemistry residue from the walls of the etching chamber. Further, the disclosed system and method can also substantially eliminate the oxide layer formed after a copper layer is exposed and further formed in a wet cleaning process.

The disclosed system and method can be performed in-situ within a plasma etch chamber. In this embodiment, the in-situ passivation operation can be combined with and in some instances incorporated into other processes that are executed within the plasma etch chamber. In this manner the total processes time within the plasma etch chamber is not significantly changed. By way of example, in one embodiment, the passivation operation requires about 30 seconds concurrently with a chuck declamping operation that requires about 60 seconds, thereby resulting no increase in process time within the plasma chamber.

An alternative embodiment includes an ex-situ process such as following a post CMP cleaning and rinsing operation. By way of example, the substrate undergoes a CMP operation and then a cleaning and rinsing operation. The substrate can then be placed in a plasma chamber where the passivation process can be performed so as to reduce the oxide layer formed during the cleaning and rinsing operation(s). This embodiment is especially useful if the operation to follow is a plasma etch or deposition operation that can occur within the plasma chamber.

An additional benefit of the present invention is that the newly exposed layer is activated. The activated layer exposes the matrix of the conductive material so that subsequent connections can be made to the conductive material. FIG. 2A shows a copper matrix 200, in accordance with one embodiment of the present invention. The matrix of the copper molecules 202 is covered by an oxide layer 204. The oxide layer 204 can be several hundreds to several thousands of angstroms in thickness. FIG. 2B shows a passivated copper matrix 200', in accordance with one embodiment of the present invention. After the passivation operation, oxide layer 204 is substantially reduced such that the matrix of the copper molecules 202 is fully exposed. The matrix of the copper molecules 202 has a slightly rougher surface. The rougher surface can increase adhesion to a subsequent layer 210 that may be formed on top of the exposed matrix of the copper molecules 202.

The passivation operation includes exposing the newly exposed copper surface to a hydrogen chemistry to reduce the surface oxide, passivate the surface and prevent corrosion in a single operation. A hydrogen gas or other gases generating hydrogen under plasma conditions (e.g., HCl, CH4, NH3, etc.) can be used to obtain the desired result. This plasma process can be used in various types of plasma reactors including inductively or capacitively coupled plasma or microwave reactors. Additional additive gases can include, for example by not limited to argon, oxygen and nitrogen.

FIG. 3A is a flowchart of the method operations 300 of a CMP process, in accordance with one embodiment of the present invention. In an operation 305, a bulk removal or planarization or other CMP operation is performed on a substrate. By way of example, the CMP operation can be used to remove an overburden portion 110 of a conductive material such as for a damascene or a dual damascene interconnect structure. The CMP operation exposes the conductive interconnects. The CMP operation can be any type of CMP operation such as a linear belt or rotary or planar table or a low down force CMP operation.

In an operation 310, the substrate is cleaned in a "wet" operation such as a deionized water rinse or similar clean operation. The wet clean operation removes the residual CMP slurry and CMP byproducts from the substrate. The wet clean operation can often be incorporated within the CMP process tool or in a separate process tool or module.

In an operation 315, the cleaned substrate is placed in a process chamber. The process chamber can be any process chamber suitable for plasma operations. In one embodiment, the processing chamber includes a processing chamber capable of having all inner surfaces substantially uniformly heated above a temperature necessary volatilize any residues that may be clinging to the inner surfaces of the process chamber (e.g., about 200 to about 400 degrees C.). The inner surfaces include those internal surfaces of the processing chamber that the substrate is exposed to. In one embodiment, the process chamber is a small volume process chamber such as described in co-owned and co-pending U.S. Patent application 10/744,355, filed on Dec. 22, 2003 and entitled "Small Volume Process Chamber with Hot Inner Surfaces," which is incorporated by reference herein, for all purposes. A small volume process chamber have a top electrode and the bottom electrode that are separated by a distance of between about 0.5 cm to about 5 cm.

In an operation 340, the surface of the exposed conductive interconnect structures are passivated. The surface passivation is described in more detail, in FIG. 4 below. As described in FIG. 3A, the surface passivation operation 340 is an ex-situ operation from the CMP operation 305.

Figure 3B:
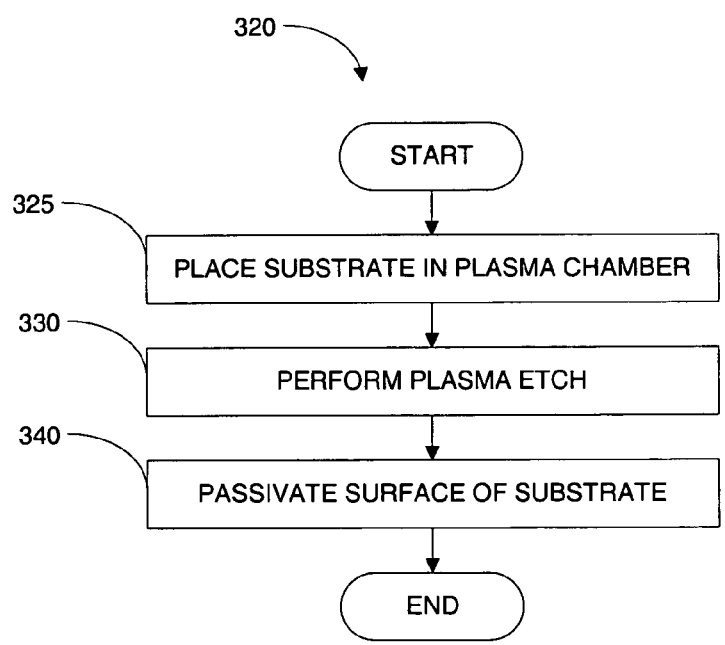
FIG. 3B is a flowchart of the method operations of an etch process, in accordance with one embodiment of the present invention.

FIG. 3B is a flowchart of the method operations 320 of an etch process, in accordance with one embodiment of the present invention. In an operation 325, a substrate is placed in a processing chamber suitable for plasma operations. The substrate can be placed within the processing chamber for other operations. By way of example, the other operations can include operations such as a plasma etching process or a deposition process (e.g., chemical vapor deposition).

In an operation 330, a process (e.g., a plasma etch process) is applied to the substrate in the processing chamber. The process can be any capable of being performed in the processing chamber. In one embodiment the process is a stress free plasma etch process such as described in U.S. Pat. 6,939,796 filed on Mar. 14, 2003 and entitled "System, Method and Apparatus For Improved Global Dual-Damascene Planarization," which is incorporated herein by reference in its entirety for all purposes and U.S. Pat. No. 6,82,899 filed on Mar. 14, 2003 and entitled "System, Method and Apparatus For Improved Local Dual-Damascene Planarization," which is also incorporated herein by reference in its entirety for all purposes. The plasma etch process exposes a conductive interconnect or device structures.

In an operation 340, the surface of the exposed conductive interconnect structures are passivated. The surface passivation is described in more detail in FIG. 4 below. As described in FIG. 3B, the surface passivation operation 340 is an in-situ operation capable of being performed within the same process chamber as another previous or subsequent operation.

Figure 4:
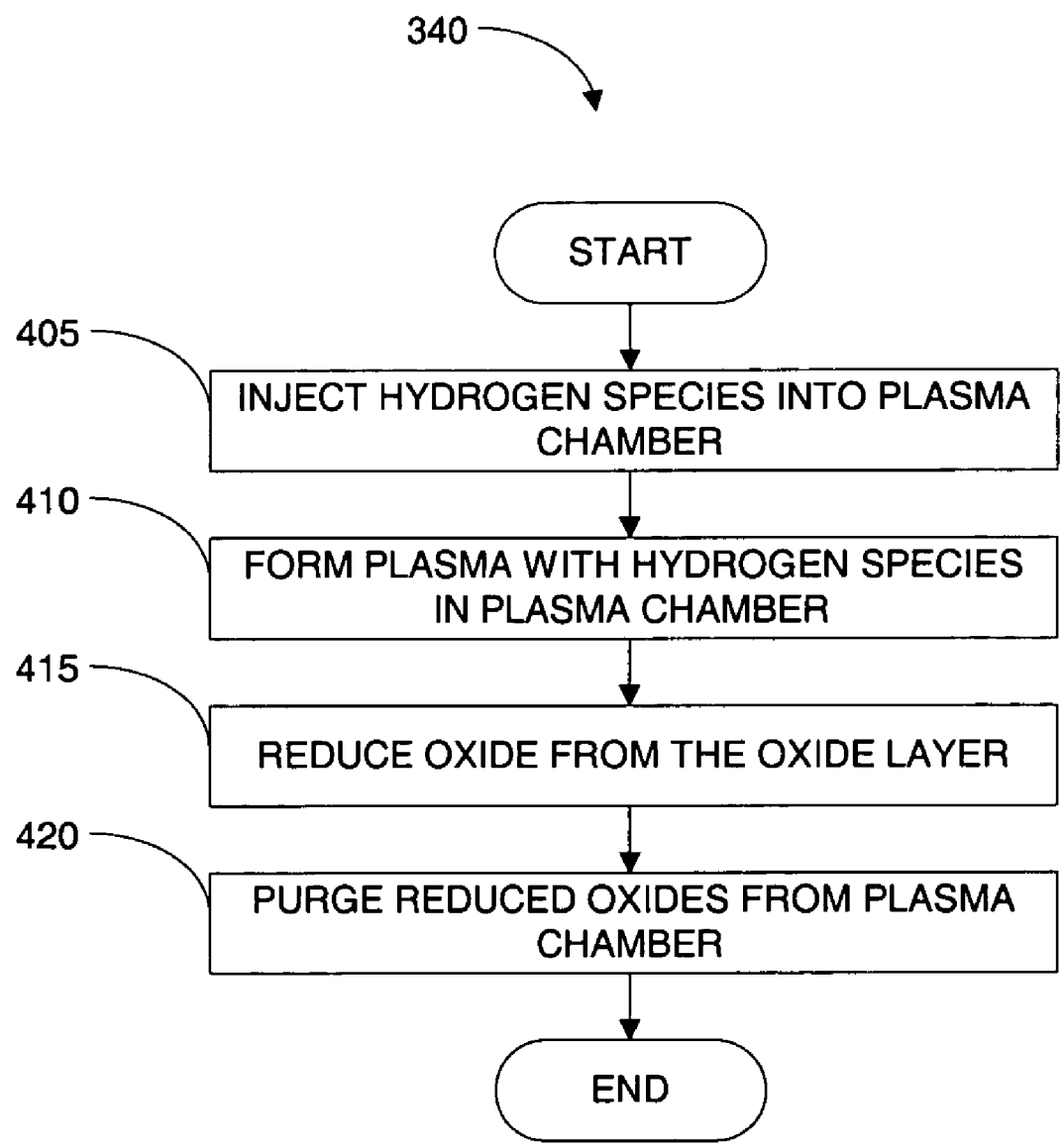
FIG. 4 is a flowchart of the method operations of a passivation process, in accordance with one embodiment of the present invention.

FIG. 4 is a flowchart of the method operations 340 of a passivation process, in accordance with one embodiment of the present invention. In an operation 405, a hydrogen containing species is injected into the plasma chamber. The plasma chamber is heated to a range of about 75 degrees C. and about 300 degrees C. The pressure of the plasma chamber is within a range of about 1 mTorr and about 100 mTorr. In one embodiment, hydrogen is injected at a flow rate of between about 20 sccm (standard cubic centimeters per minute) and about 200 sccm. The hydrogen can be carried on an inert carrier gas (e.g., argon) at a flow rate of about 20 to about 2000 sccm.

In an operation 410, a plasma is formed with the hydrogen species. The high energy of the plasma and the relatively high temperature (e.g., about 75 to about 300 degrees C. or more) can cause the majority of the residue materials (e.g., CMP residues or etchant residues) on the substrate to become volatile. Desirable temperature range for the substrate is about 200 to about 400 degrees C. Similarly the etchant residues on the inner surfaces of the processing chamber also become volatile. Desirable temperature range for the process chamber is about 200 to about 400 degrees C. The volatilized residue materials can be purged in an operation 420 below. The plasma can be formed in any type of plasma chamber (e.g., inductive, capacitive, etc.). By way of example, in an exemplary inductive plasma chamber, a power applied to top is between about 500 to about 3000 watts of power. The bottom electrode can have a power applied of between about 0 to about 100 watts of power. Similarly in a capacitive plasma chamber, system power in the range of about 500 to about 5000 W can be applied to the bottom and/or top electrode(s). The RF power supply can be affected with either a single or dual frequency.

In an operation 415, the oxide layer is reduced. By way of example, the hydrogen plasma causes the oxygen atoms in the oxide surface layer to disassociate with the conductive material (e.g., copper) and to combine with the hydrogen to form water molecules. Any remaining hydrogen atoms, any oxygen atoms disassociated from the conductive material and the formed water molecules can be purged in an operation 420 below. The oxide layer reduction and the volatilized residue materials are completed in about 15 seconds to about 2 minutes. While no maximum time is indicated, the majority of the oxide layer and volatilizing the residue materials can be accomplished in less than about 2 minutes. In an operation 420, the oxides, hydrogen, water vapor and volatilized residue materials are purged from the processing chamber and the method operations end.

By way of example in one embodiment, a substrate is loaded in a capacitively coupled plasma etch chamber. The plasma etch chamber is heated to a temperature of about 250 degrees C., at a pressure of about 20 mTorr. The top electrode of the plasma etch chamber has about 1000 watts applied and zero power is applied to the bottom electrode. About 100 sccm of $H_2$ and about 100 sccm of argon is injected into the plasma etch chamber to generate a hydrogen species plasma. The substrate is exposed to the hydrogen plasma for about 60 seconds to reduce the oxides in the top surface of the substrate.

While the above-described embodiments are described in terms of copper device and interconnect structures, the embodiments are not limited to only copper. Etching magnetic materials (NiFe, CoFe, AlO, etc.) and electrode materials (Ta, TaN, Pt, Ir, etc.) can also be performed by similar processes.

It will be further appreciated that the instructions represented by the operations in any of the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of passivating an exposed conductive material comprising:
    placing a substrate in an etch process chamber, wherein the substrate includes a conductive overburden portion formed over a plurality of features, the overburden portion having a non-uniformity;
    planarizing the substrate to remove a bulk of the overburden portion and substantially remove the non-uniformity without imparting stress to the plurality of features including:
        injecting a hydrogen containing species into the process chamber, the hydrogen containing species includes at least one of a group consisting of HCl, HBr, $CH_4$ and $NH_3$;
        forming a hydrogen containing species plasma in the process chamber; and
        removing a surface layer species from a top surface of the substrate, the surface layer species includes at least one of an oxide, a halide or a nitride; and purging the removed surface layer species from the process chamber.

2. The method of claim 1, wherein the conductive material includes at least one of a group consisting of a copper containing material, elemental copper, NiFe, CoFe, elemental Ni, Co, Ru, AlO, Ta, TaN, Pt and Ir.

3. The method of claim 1, wherein the passivation process is performed in situ.

4. The method of claim 1, wherein the process chamber has a temperature of between about 30 and about 200 degrees C.

5. The method of claim 1, wherein the process chamber is a small volume plasma chamber.

6. The method of claim 1, wherein the process chamber includes at least one of an inductively coupled system, an ECR and a microwave powered system.

7. The method of claim 1, wherein the process chamber has a pressure of between about 1 mTorr and about 500 mTorr.

8. The method of claim 1, wherein the process chamber is a capacitively coupled system.

9. The method of claim 1, wherein injecting the hydrogen containing species includes injecting a carrier gas.

10. The method of claim 9, wherein the carrier gas includes at least one of a group consisting of argon, nitrogen, helium, neon and xenon.

11. The method of claim 1, wherein forming a plasma with the hydrogen species includes volatilizing a residue on at least one of the substrate and an inner wall of the process chamber and wherein purging the reduced surface layer species from the process chamber includes purging the volatilized residue.

12. The method of claim 1, wherein removing the surface layer species from the top surface of the substrate includes:
    activating the top surface of the substrate; and
    roughening the top surface including exposing a matrix of the top surface material, wherein the exposed matrix provides an increased adhesion to a subsequent formed layer formed on the exposed matrix.

13. The method of claim 1, wherein the exposed conductive material is passivated with a predetermined time, the predetermined time being sufficient to remove the surface layer species from the top surface of the substrate a desired amount.

14. The method of claim 13, wherein the predetermined time is greater than about 15 seconds.

15. A method of passivating an exposed copper interconnect comprising:
    placing a substrate in a process chamber wherein the process chamber has a temperature of between about 30 and about 200 degrees C., wherein the process chamber has a pressure of between about 51 mTorr and about 500 mTorr;
    injecting a hydrogen containing species into the process chamber, the hydrogen containing species includes at least one of a group consisting of HCl, HBr, $CH_4$ and $NH_3$;
    forming a hydrogen containing species plasma in the process chamber;
    reducing a copper oxide from a top surface of the exposed copper interconnect including:
        activating the top surface of the substrate; and
        roughening the top surface including exposing a matrix of the top surface material, wherein the exposed matrix provides an increased adhesion to a subsequent formed layer formed on the exposed matrix; and purging the reduced copper oxide from the process chamber.

* * * * *